US009797963B2

United States Patent
Friedrich et al.

(10) Patent No.: US 9,797,963 B2
(45) Date of Patent: Oct. 24, 2017

(54) SYSTEMS AND METHODS FOR A MAGNETIC TARGET WITH MAGNETIC BIAS FIELD

(71) Applicant: Allegro Microsystems, LLC, Worcester, MA (US)

(72) Inventors: Andreas P. Friedrich, Metz-Tessy (FR); Yannick Vuillermet, La Motte Servolex (FR)

(73) Assignee: Allegro MicroSystems, LLC, Worcester, MA (US)

( * ) Notice: Subject to any disclaimer, the term of this patent is extended or adjusted under 35 U.S.C. 154(b) by 63 days.

(21) Appl. No.: 14/224,106

(22) Filed: Mar. 25, 2014

(65) Prior Publication Data

US 2015/0276434 A1   Oct. 1, 2015

(51) Int. Cl.
| | | |
|---|---|---|
| G01R 33/09 | (2006.01) | |
| H01F 7/02 | (2006.01) | |
| G01R 33/06 | (2006.01) | |
| G01D 5/244 | (2006.01) | |

(52) U.S. Cl.
CPC ....... *G01R 33/093* (2013.01); *G01D 5/24438* (2013.01); *G01R 33/06* (2013.01); *H01F 7/02* (2013.01)

(58) Field of Classification Search
CPC .............. G01R 33/09; H01F 7/02; G01D 5/16
USPC ..................................... 324/207.25, 173–174
See application file for complete search history.

(56) References Cited

U.S. PATENT DOCUMENTS

| | | | | |
|---|---|---|---|---|
| 4,401,944 A | * | 8/1983 | Narimatsu | G01V 3/081 324/207.21 |
| 5,654,854 A | * | 8/1997 | Mallary | B82Y 10/00 360/327.3 |
| 5,920,262 A | * | 7/1999 | Copeland | G08B 13/2411 335/284 |
| 5,959,810 A | | 9/1999 | Kakihara et al. | |
| 6,300,758 B1 | * | 10/2001 | Griffen | G01D 5/145 324/207.12 |

(Continued)

OTHER PUBLICATIONS

Kanai et al.; "Spin-Valve Sensors with Domain Control Hard Magnet Layers;" IEEE Transactions on Magnetics, vol. 31, No. 6; Nov. 1995; pp. 2612-2614.

(Continued)

*Primary Examiner* — Giovanni Astacio-Oquendo
*Assistant Examiner* — Alvaro Fortich
(74) *Attorney, Agent, or Firm* — Daly, Crowley, Mofford & Durkee, LLP (57) ABSTRACT

Systems and techniques for a detecting a magnetic target that reduce output signal jitter are disclosed. A system includes a magnetic target. The magnetic target has a plurality of regions having juxtaposed edges and opposing ends. Adjacent ones of the plurality of regions have different magnetic polarities. The magnetic target includes a first magnetic strip, having a first magnetic polarity disposed at one end of the regions, and a second magnetic strip having a second magnetic polarity opposite to the first magnetic polarity disposed at a second end of the regions to generate a magnetic bias across at least a portion of the regions. The system includes at least one magnetic field sensing element placed in proximity to the magnetic target and configured to produce an output signal responsive to the magnetic target.

27 Claims, 9 Drawing Sheets

(56) References Cited

U.S. PATENT DOCUMENTS

| | | | | |
|---|---|---|---|---|
| 6,490,140 | B1* | 12/2002 | Mao | B82Y 10/00 360/324.11 |
| 6,574,058 | B1* | 6/2003 | Aruga | G06K 7/084 360/2 |
| 6,810,126 | B2* | 10/2004 | Levitsky | H04R 7/04 181/157 |
| 7,108,183 | B1* | 9/2006 | Cox, Jr. | G06Q 30/00 235/385 |
| 7,183,760 | B2* | 2/2007 | Mol | G01P 3/487 324/174 |
| 2003/0169039 | A1* | 9/2003 | Kang | G01R 33/05 324/260 |
| 2004/0066187 | A1* | 4/2004 | Schroter | G01D 5/14 324/207.22 |
| 2004/0090135 | A1* | 5/2004 | Maslov | H02K 1/32 310/156.08 |
| 2006/0044094 | A1* | 3/2006 | Davis | A63H 33/26 335/220 |
| 2006/0161112 | A1* | 7/2006 | Steffen | A61M 5/31553 604/188 |
| 2006/0208600 | A1* | 9/2006 | Sahyoun | H02K 33/16 310/254.1 |
| 2008/0246573 | A1* | 10/2008 | Souder | A61N 2/06 335/306 |
| 2009/0009160 | A1* | 1/2009 | LaCroix | G01D 5/145 324/207.25 |
| 2009/0078484 | A1* | 3/2009 | Kocijan | B60L 13/04 180/167 |
| 2009/0139908 | A1* | 6/2009 | Zhou | B03C 1/033 209/225 |
| 2009/0295521 | A1* | 12/2009 | Fullerton | G01D 18/00 335/306 |
| 2011/0298451 | A1* | 12/2011 | Sterling | B82Y 25/00 324/207.21 |
| 2012/0280769 | A1* | 11/2012 | Kondo | H01P 1/203 333/204 |
| 2013/0091960 | A1* | 4/2013 | Lee | G01L 3/1435 73/862.335 |
| 2013/0232764 | A1* | 9/2013 | Lee | G01L 3/1435 29/428 |
| 2016/0305795 | A1 | 10/2016 | Eisenbeis | |

OTHER PUBLICATIONS

Response (with summary and claims) filed on Mar. 30, 2016 to the Office Action dated Oct. 5, 2015; for European Pat. App. 15160759.5; 11 pages.

European Patent Office Extended Search Report dated Aug. 20, 2015; for European Pat. App. No. 15160759.5-1560; 13 pages.

* cited by examiner

SYSTEMS AND METHODS FOR A MAGNETIC TARGET WITH MAGNETIC BIAS FIELD

FIELD

This disclosure relates to magnetic targets for detecting motion and position, and more particularly, to magnetic targets having regions with alternating magnetic polarities.

BACKGROUND

Magnets are often used in the detection of speed and position of a moving object by a magnetic field sensor. For example, a magnet placed on a rotating wheel or shaft will produce a magnetic field. As the wheel or shaft spins, the magnetic field will also spin and change position. A magnetic field sensor placed near the wheel or shaft generates a signal that represents a detected magnetic field and that can be used to compute speed of rotation, current position, direction of rotation and other parameters associated with the wheel or shaft.

One type of magnet often used in such applications is a segmented ring magnet that is divided into regions or domains having alternating, opposite magnetic polarities. Another type of magnet is a segmented bar magnet that is divided into regions or domains having alternating, opposite magnetic polarities. In some instances, the magnetic field signal generated when sensing a field associated with a rotating ring magnet or moving bar magnet can experience undesirable instability or variations in the timing of its transitions, which can be referred to as jitter.

SUMMARY

In an embodiment, a magnetic target comprises a plurality of regions having juxtaposed edges and opposing ends. Adjacent ones of the plurality of regions have different magnetic polarities. A first magnetic strip, having a first magnetic polarity, is disposed at one end of the regions, and a second magnetic strip, having a second magnetic polarity opposite to the first magnetic polarity, is disposed at a second end of the regions to generate a magnetic bias across at least a portion of the regions.

In another embodiment, a system includes a magnetic target. The magnetic target has a plurality of regions having juxtaposed edges and opposing ends. Adjacent ones of the plurality of regions have different magnetic polarities. The magnetic target includes a first magnetic strip having a first magnetic polarity disposed at one end of the regions, and a second magnetic strip having a second magnetic polarity, opposite to the first magnetic polarity, disposed at a second end of the regions to generate a magnetic bias across at least a portion of the regions. The system includes at least one magnetic field sensing element placed in proximity to the magnetic target and configured to produce an output signal responsive to the magnetic target.

In another embodiment, a method includes placing a magnetic field sensing element adjacent to a magnetic target. The magnetic target has a plurality of regions having juxtaposed edges and opposing ends. Adjacent ones of the plurality of regions have different magnetic polarities. The method also includes placing a first magnetic strip proximate to a first end of the regions, and a second magnetic strip proximate to a second, opposite end of the regions to produce a magnetic bias across at least a portion of the regions. The magnetic target, the magnetic field sensing element, or both are moved relative to one another. An output signal representing magnetic fields produced by the regions is generated.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

Before describing the present invention, some information is provided.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, a magnetic tunnel junction (MTJ), a spin-valve, etc. The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR, spin-valve) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the terms "target" and "magnetic target" are used to describe an object to be sensed or detected by a magnetic field sensor or magnetic field sensing element.

Figure 1A:
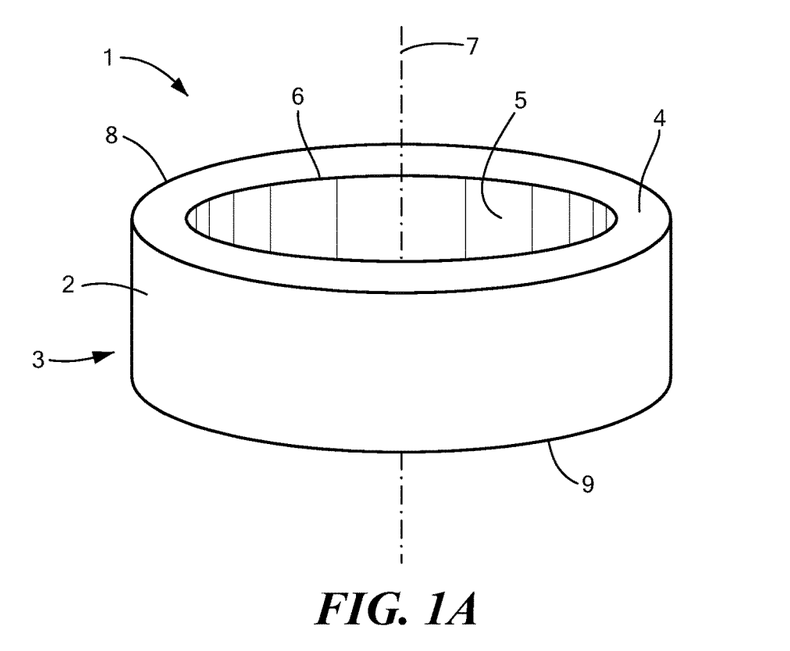
FIG. 1A is an isometric view of a ring magnet.

FIG. 1A is an isometric view of a ring magnet 1. Before describing the invention, terminology relating to parts and views of a ring magnet will be described with relation to FIG. 1A. The "side" of ring magnet 1 is the outer surface 2. Therefore, a "side view" of ring magnet 1 is a visual representation of ring magnet 1 made as though the view is looking at the ring magnet from direction 3, for example.

The "outer surface" of ring magnet 1 refers to the side surface—i.e. the outer surface 2 of ring magnet 1. The "inner surface" refers to surface 5 inside the ring magnet.

The "top" of ring magnet 1 refers to surface 4. The "bottom" of ring magnet 1 refers to a surface 9 opposite surface 4. "Top" and "bottom" are arbitrary labels for the indicated surfaces that can be interchanged with each other, so long as the top and bottom surfaces are opposite each other.

The "inner circumference" refers to a circle or cylinder formed by inner edge 6 of ring magnet 1. The inner circumference may represent points on ring magnet 1 that are closest to a central axis 7. The "outer circumference" refers to a circle or cylinder formed by outer edge 8 of ring magnet 1. The outer circumference my represent points on ring magnet 1 that are farthest from central axis 7.

Figure 1B:
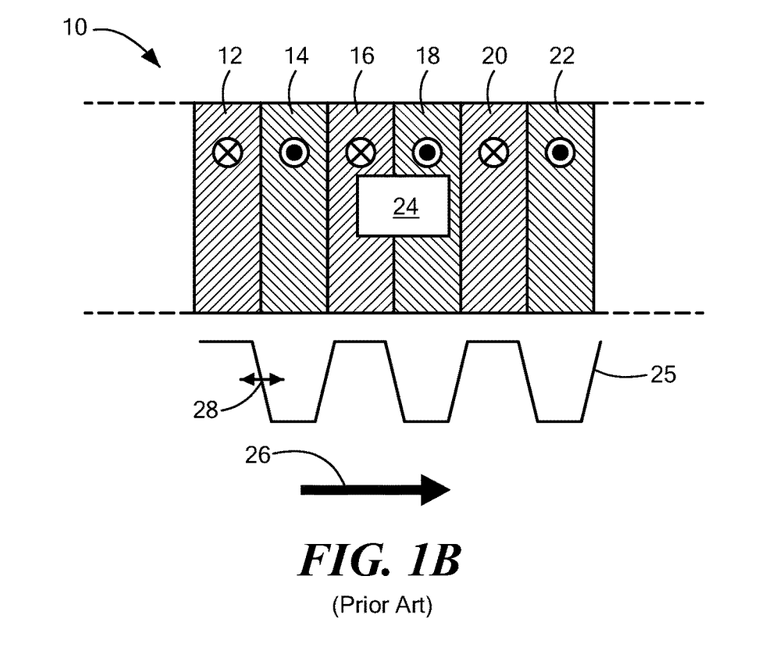
FIG. 1B is a side view of a ring magnet of the prior art and an output signal from a magnetic field sensor.

FIG. 1B is a side view of a portion of a ring magnet 10 of the prior art. Ring magnet 10 is divided into magnetic regions 12-22. Regions 12, 16, and 20 are north-polarized so that the direction of the magnetic fields they produce go into the page, as indicated by the symbol "X". Alternating regions 14, 18, and 22 produce a magnetic field with an opposite direction, i.e. a south-polarized magnetic field with a direction coming out of the page, as indicated by the "•" symbol. A magnetic field sensing element 24 is placed adjacent to ring magnet 10.

As ring magnet 10 moves in the direction of arrow 26, magnetic field sensing element 24 detects the magnetic fields produced by magnetic regions 12-22 and produces an output signal 25 representing the detected magnetic field. When a north-polarized magnetic region (e.g. region 12, 16, or 20) is adjacent to magnetic field sensing element 24, signal 25 may be high. When a south-polarized magnetic region (e.g. region 14, 18, or 22) is adjacent to magnetic field sensing element 24, signal 25 may be low.

As ring magnet 10 moves in the direction of arrow 26 and magnetic regions 12-22 move relative to magnetic field sensing element 24, signal 25 will transition from high to low and low to high, as shown in FIG. 1B. These edge transitions may experience instability resulting in jitter on signal 25 as indicated by arrow 28. As known in the art, jitter is undesirable variations in pulse frequencies or pulse widths of a signal. Jitter can be viewed as an instability of rising or falling edges of a signal in time with respect to a reference frequency. Jitter can result in inaccuracies and loss of precision when detecting the speed and position of ring magnet 10.

Figure 2:
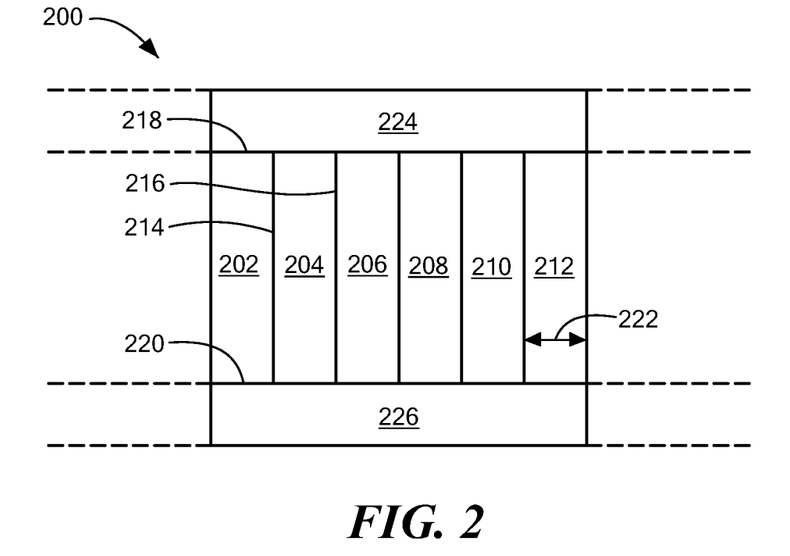
FIG. 2 is a side view of a magnetic target according to an embodiment.

FIG. 2 is a side view of a portion of a magnetic target 200 according to an embodiment. As shown, in an embodiment, magnetic target 200 is ring-shaped and has a plurality of regions 202-212. Regions 202-212 have juxtaposed edges, e.g. edges 214 and 216. Each region also has opposing ends 218 and 220.

Adjacent regions 202-212 of magnetic target 200 have different magnetic polarities. For example, if each region 202-212 is comprised of a hard ferromagnetic material (.e.g. a permanent magnet), the polarities of the magnetic regions may alternate. In such an embodiment, magnetic regions 202, 206, and 210 may have a positive (e.g. north) magnetic polarity on the outer surface of target 200, and magnetic regions 204, 208, and 212 may have an opposite, negative (e.g. south) magnetic polarity. In another embodiment, only every other region of magnetic target 200 produces a magnetic field. For example, regions 202, 206, and 208 may produce a north or south-polarized magnetic field, while regions 204, 208, and 212 are not magnetized and do not produce a magnetic field. In another embodiment, the magnetic polarization of regions 202-212 can alternate between north polarization, south polarization, and no polarization. As an example, region 202 may be north-polarized, region 204 may have no polarization, region 206 may be south polarized, etc. In general, any arrangement of magnetic polarization can be used so long as the magnetic polarization changes at the boundary of at least some of the juxtaposed edges (e.g. edges 214, 216).

Although regions 202-212 are shown as having the same width 222, this is not a requirement. Regions 202-212 may each have the same width, or different widths as desired.

Magnetic target 200 also has a first magnetic strip 224 disposed adjacent to one end 218 of the regions 202-212, and a second magnetic strip 226 disposed adjacent to the opposite end 220 of regions 202-212. As shown, magnetic strip 224 may form the top and magnetic strip 226 may form the bottom of ring-shaped target 200. Magnetic strips 224 and 226 may be magnetized portions of the body of ring-shaped target 200 that are formed by magnetizing those portions to a desired polarity. In other embodiments, magnetic strips 224 may be separate from the body and placed adjacent to the body.

In an embodiment, magnetic strips 224 and 226 have opposite magnetic polarities. For example, magnetic strip 224 may be north-polarized so the direction of a magnetic field produced by magnetic strip 224 points into the page, and magnetic strip 226 may be south polarized so a magnetic field produced by magnetic strip 226 has a direction pointing out of page, or vice versa.

Magnetic strips 224 and 226 may extend the entire length or circumference of magnetic target 200. In other embodiments, magnetic strips 224 and 226 may extend across only a portion of magnetic target 200. In certain applications, target 200 may have some portions with magnetic strips 224 and 226, and other portions without magnetic strips 224 and 226. In yet another embodiment, the magnetic strips 224 and 226 adjacent to different portions of magnetic target 200 may have different polarities. For example, at one portion of target 200, magnetic strip 224 may be north-polarized and magnetic strip 226 may be south-polarized. At another portion of target 200, magnetic strip 224 may be south-polarized and magnetic strip 226 may be north-polarized.

In an embodiment, at least some of regions 202-212 and magnetic strips 224 and 226 are permanent magnets made of a hard ferromagnetic material, such as sintered or polymer/plastic bonded material, and the like. In other embodiments, at least some of regions 202-212 and magnetic strips 224 and 226 are made of hard ferromagnetic material, such as SmCo, NdFeB, AlNiCo, a hard ferrite, and the like. Target 200 may be formed by sintering or molding target 200 and subsequently magnetizing regions 202-212 and/or strips 224 and 226 with the desired polarities. Target 200 may also be formed by attaching or bonding separate regions 202-212 and/or strips 224 and 226 to each other to form target 200. Target 200 may also be formed by a combination magnetizing regions 202-212 and/or strips 224 and 226, and attaching or bonding regions 202-212 and/or strips 224 and 226. In various embodiments, a moldable magnet material (e.g. a magnet material formed by injection molding) may be used to form the entire body of target 200, or some or all of the regions 202-212 of the target 200. In other embodiments, at least some of regions 202-212 comprise electromagnets, coils, or other elements that produce magnetic fields.

Figure 3:
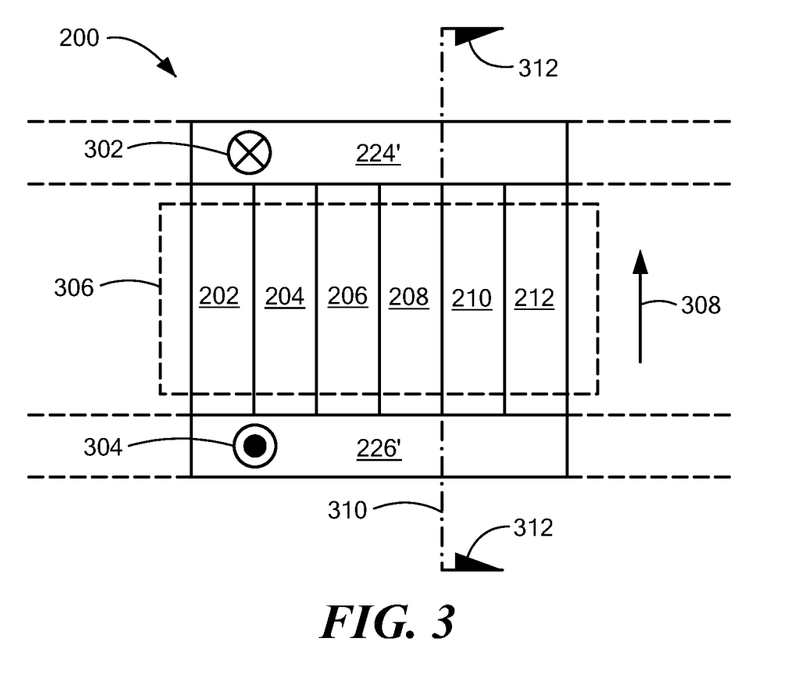
FIG. 3 is a side view of a magnetic target, for example, the target of FIG. 2 additionally illustrating a bias field and magnetic polarities of the magnetic strips.

FIG. 3 is a side view of a portion of magnetic target 200 additionally illustrating magnetic polarities and a bias field. As shown, magnetic strip 224' is a north-polarized magnetic strip (as indicated by the "X" symbol 302) and magnetic strip 226' is a south-polarized magnetic strip (as indicated by the "•" symbol 304). Because magnetic strips 224' and 226' have opposite polarity, and because they are disposed at opposite ends 218, 220 of regions 202-212, magnetic strips 224' and 226' produce a magnetic bias field 306 across regions 202-212. Magnetic bias field 306 is a magnetic field with direction shown by arrow 308. As shown, magnetic field 306 may have a direction that generally points from south-polarized magnetic strip 226' to north-polarized magnetic strip 224'. In embodiments where magnetic strip 224' is south-polarized and magnetic strip 226' is north-polarized, magnetic bias field 306 may have a direction opposite to that shown in FIG. 3.

One skilled in the art will recognize that the polarity of the magnetic strips (and other magnetic regions) may be substantially perpendicular to the plane formed by the page, but may not be perfectly perpendicular to the plane formed by the page. For example instead of coming out of or going into the page at 90 degrees, the magnetic polarities may be offset at other angles coming out of the page between, say, 45 and 90 degrees with respect to the plane formed by the page, or at other angles going into the page between, say, 45 and 90 degrees with respect to the plane formed by the page. The polarities may be at other angles with respect to the page as well. Such offset angles can be due, at least in part, to tolerances in the magnetization process.

One skilled in the art will recognize that the strength of the magnetic field produced by magnetic strip 224' may be different than the strength of the magnetic field produced by magnetic strip 226', or vice versa. For example, the strength of the magnetic field produced by magnetic strip 224' may be greater than or less than the strength of the magnetic strip produced by magnetic strip 226'. In other embodiments, the magnetic fields produced by magnetic strips 224' and 226' have substantially the same strength.

Magnetic strip 224' may produce a magnetic field having substantially uniform strength along its length, and magnetic strip 226' may produce a magnetic field having a substantially uniform strength along its length. Accordingly, magnetic bias field 306 may have substantially uniform strength across the regions 202-212, i.e. across the length of magnetic strips 224' and 226'. In other embodiments, the strength of the magnetic field produced by magnetic strip 224' may vary along its length, and/or the strength of the magnetic field produced by magnetic strip 226' may vary along its length, if desired. This may result in a magnetic bias field 306 with a strength that varies across regions 202-212.

Figure 4:
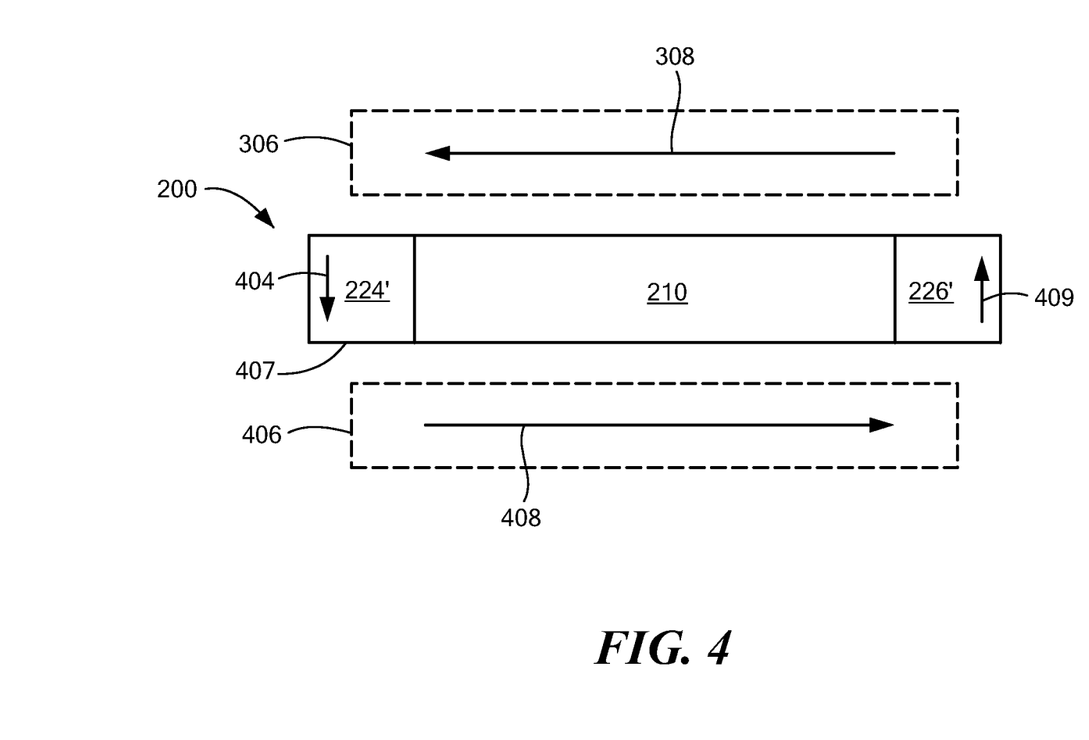
FIG. 4 is a cross-sectional view of a magnetic target, for example the magnetic target of FIG. 2.

FIG. 4 is a cross-section of magnetic target 200 of FIG. 3, as viewed from line 310 in the direction of arrows 312. As described above, magnetic strip 224' produces a magnetic field having the direction of arrow 404. Magnetic strip 226' produces a magnetic field having the opposite direction, as shown by arrow 409. These magnetic fields sum together to produce a magnetic bias field 306 having a direction 308 across regions 202-212. Magnetic strips 224' and 226' may also produce a magnetic bias field 408 on the inner surface 407 of target 200. Due to the magnetic polarities of magnetic strips 224' and 226', magnetic bias field 406 may have a direction (shown by arrow 408) opposite to the direction of magnetic bias field 306.

One skilled in the art will recognize that, although shown as separate elements in FIG. 4, magnetic bias field 306 and magnetic bias field 406 may be portions of a continuous or composite magnetic field. The magnetic field may have a direction 404 near magnetic strip 224' and a direction 409 near magnetic strip 226'. The continuous magnetic field may have direction generally as shown by arrow 308 near the outer surface 402 of magnetic target 200, and a direction generally as shown by arrow 408 near the inner surface 407 of magnetic target 200. One skilled in the art will recognize that arrows 308, 404, 408, and 409 are provided to aid in the conceptual understanding of the general direction of the magnetic field, and may or may not represent the actual magnetic field lines produced by a ring magnet 200 at any specific location.

Figure 5:
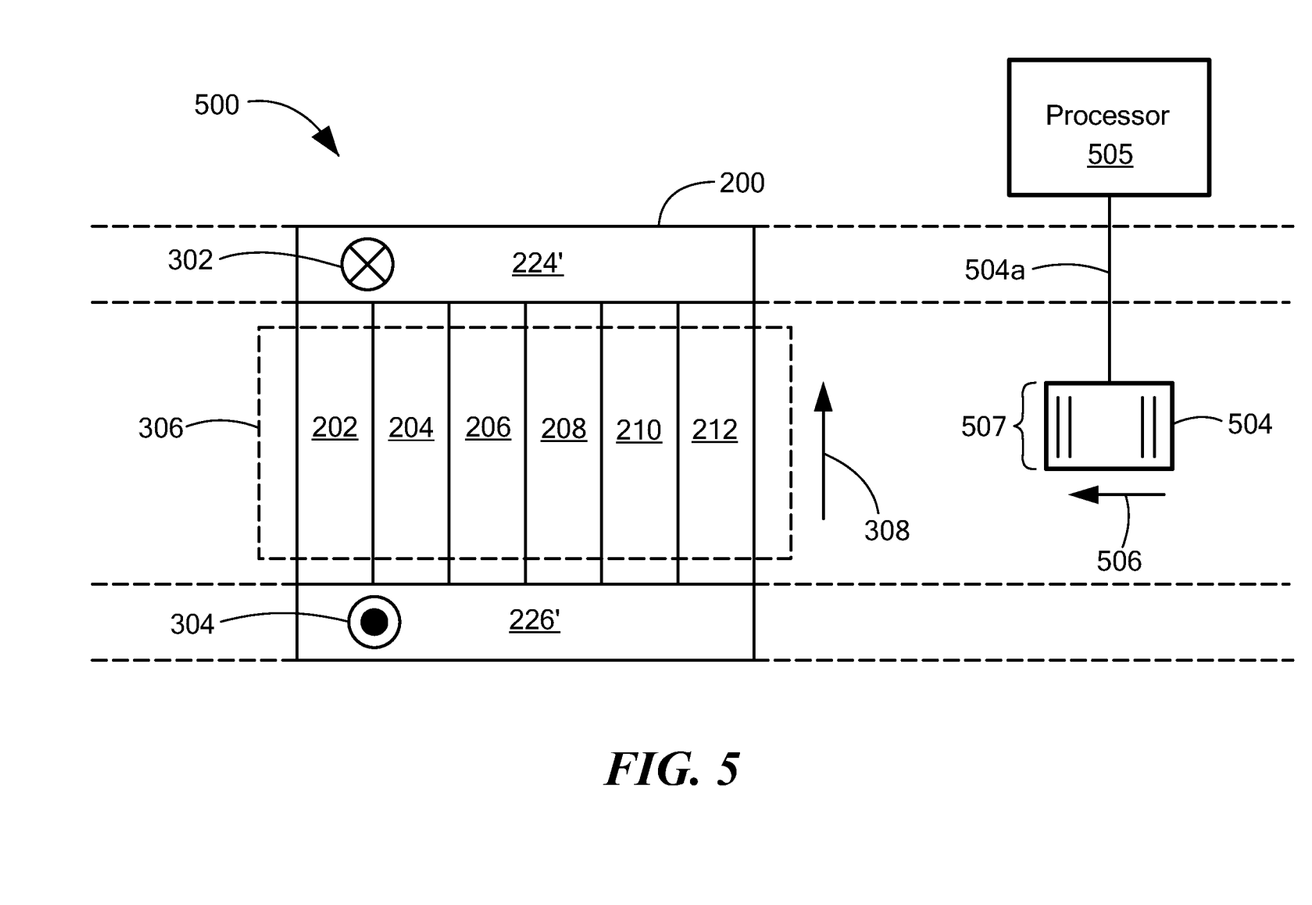
FIG. 5 is a side view of a system for detecting a magnetic target, for example the magnetic target of FIG. 2.

FIG. 5 is a side view of a system 500 including magnetic target 200. System 500 also includes a magnetic field sensing element 504, which may be a Hall Effect element, a giant-magnetoresistance (GMR) element, a magnetoresistance element, or another type of magnetic field sensing element. Magnetic field sensing element 504 is coupled to processor 505 via one or more signal lines so that magnetic field sensing element 504 can provide signal 504a to processor 505. Signal 504a is an electrical signal (e.g. a voltage or current signal) produced by magnetic field sensing element 504 in response to the magnetic field detected by magnetic field sensing element 504.

Processor 505 is a circuit, computer processor, or other electronic device or system that can receive and process signal 504a. In an embodiment, processor 505 may include circuitry, software, or a combination of circuitry and software elements for processing signal 504a (and/or for performing other functions). For example, processor 505 may include amplifiers, signal processors, or other elements that can be used to process signal 504a. In an embodiment, processor 505 is a microprocessor, a digital-signal processor chip, or another type of processor programmed to process signal 504a. In other embodiments, processor 505 is a custom-designed circuit, system, or integrated circuit designed for processing signal 504a. In an embodiment, processor 505 and magnetic field sensing element 504 are located on the same integrated circuit or silicon chip. In other embodiments, processor 505 and magnetic field sensing element 504 are located on different silicon chips, which may be contained in the same or in separate integrated circuit packages or assemblies. Depending on the application, the processor 505 may be configured to provide one or more signals indicative of a speed of rotation of an article, a direction of rotation, a proximity of an article, a position of an article, etc.

Magnetic field sensing element 504 may be placed in proximity to magnetic target 200 so that it can detect the magnetic fields produced by regions 202-212. Magnetic field sensing element 504 may be placed adjacent to the outer surface 402 or the inner surface 407 of target 200, as desired. Preferably, magnetic field sensing element 504 is close enough to target 200 to detect the magnetic fields produced by regions 202-212.

As regions 202-212 move relative to magnetic field sensing element 504, the magnetic field detected by magnetic field sensing element 504 will change, and the output signal 504a, produced by magnetic field sensing element 504, that represents the detected magnetic field will also change. If, as described above, magnetic bias field 306 has uniform strength along the length of magnetic target 200, then the magnetic bias field 306 will have a constant effect on magnetic field sensing element 504 and will not cause perturbations in the level of the output signal 504a. In other words, since the strength of magnetic bias field 306 is constant, as magnetic target 200 moves, any changes in the magnetic field detected by magnetic field sensing element 504 will be caused by movement of regions 202-212, not by magnetic bias field 306.

If, as described above, the strength and/or polarity of the magnetic fields produced by magnetic strips 224' and 226' is different for different portions of magnetic target 200, then the magnetic bias field 306 may not have uniform strength and/or direction along the length of target 200. In this instance, magnetic bias field 306 may have a different strength or direction for different portions of magnetic target 200. Thus, as magnetic target 200 moves relative to magnetic field sensing element 504, changes in magnetic bias field 306 at the borders of these portions may be detected by magnetic field sensing element 504, in addition to changes in the magnetic field due to movement of regions 202-212. In such an embodiment, magnetic field sensing element 504 may be able to detect not only regions 202-212, but also the different portions of magnetic target 200 that have different strengths or polarities of magnetic bias field 306.

In an embodiment, magnetic field sensing element 504 is a magnetoresistive element. Thus, magnetic field sensing element 504 may include one or more magnetoresistors. As is known in the art, the magnetoresistors may be connected in a bridge fashion within magnetic field sensing element 504. The resistance of the magnetoresistors may change in the presence of the magnetic fields produced by regions 202-212 and, as a result, change the level of the output signal 504a produced by magnetic field sensing element 504.

As is known in the art, magnetoresistive elements may comprise GMR elements, TMR elements, AMR elements, spin valves, etc.

Magnetoresistive elements may have one or more "pinned" layers. The pinned layers have a magnetic orientation (i.e. magnetic direction) that does not substantially change in the presence of external magnetic fields. Magnetoresistive elements may also have one or more unpinned layers. The magnetic orientations of the unpinned layers do change in the presence of external magnetic fields. When the magnetic orientation of the unpinned layer rotates with respect to that of the pinned layer, the resistance of the magnetoresistive element changes. This change in resistance can be used to detect the presence of an external magnetic field.

Magnetic field sensing element 504 may be positioned so that the pinned layer of magnetic field sensing element 504 is substantially perpendicular to the orientation of the magnetic bias field 306. For example, in FIG. 5, magnetic field sensing element 504 is a GMR element. The pinned layer of magnetic field sensing element 504 has an orientation shown by arrow 506, which is substantially perpendicular to the orientation 308 of magnetic bias field 306.

Magnetic strips 224' and 226' may be configured to produce a magnetic bias field 306 having sufficient strength to reduce jitter in the output signal 504a produced by magnetic field sensing element 504. If magnetic field sensing element 504 is a GMR element, magnetic strips 224' and 226' may be configured to produce a magnetic field according to the following formula:

$$H = \frac{t}{w} M_s$$

In the preceding formula, H is the magnetic bias field strength at the point where magnetic field sensing element 504 intersects magnetic bias field 306, w is the width 507 of the free layer of magnetic field sensing element 504, t is the thickness (i.e. the height perpendicular to the page) of the free layer of magnetic field sensing element 504, and $M_s$ is the saturation level of the free layer of magnetic field sensing element 504.

GMR sensors are made of several thin layers of magnetic material separated by non-magnetic material. Ideally the magnetization of each magnetic layer should be uniform, but it is possible that magnetic domains within the layers are generated either during the manufacturing process or during sensor operation. These magnetic domains can degrade the sensor repeatability performance.

A magnetic bias field across the GMR sensor can prevent the formation of such magnetic domains and therefore improve repeatability performance of GMR sensors. In some embodiments, improving the repeatability results in reduced jitter on an output signal of the GMR sensor.

As noted above, instability in the transitions in the magnetic field signal 504a can cause jitter of a magnetic field sensing element, such as magnetic field sensing element 504. The presence of magnetic bias field 306 can reduce the jitter on the output signal. In particular, jitter can be reduced if the orientation 506 of the pinned layer of magnetic field sensing element 504 is positioned perpendicularly with respect to the orientation 308 of a magnetic bias field 306. Thus, a magnetic target having magnetic strips 224' and 226', that produce magnetic bias field 306 with orientation 308 can reduce jitter on the output signal 504a of magnetic field sensing element 504 having a pinned layer with magnetic orientation 506.

Figure 6A:
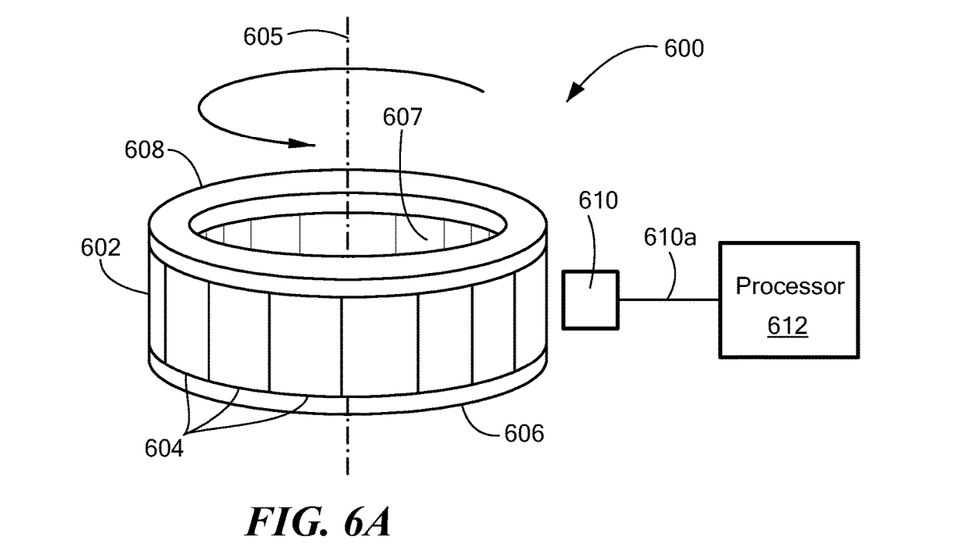
FIG. 6A and FIG. 6B are isometric views of a system for detecting a radial ring-shaped magnet target.

FIG. 6A is an isometric view of a system 600 that includes a magnetic target 602. Magnetic target 602 may be the same as or similar to target 200 (see FIG. 2). Magnetic target 602 has an array of regions 604, which may be the same as or similar to regions 202-212, and which may have different magnetic polarities, as described above with respect to regions 202-212. Magnetic target 602 may be referred to as a radial ring-shaped target because regions 604 are arranged so that their magnetic direction is parallel to a radius of the ring-shaped target (e.g. parallel to a line extending perpendicularly from a central axis 605 to a point on inner surface 607).

To produce a magnetic bias field across regions 604, magnetic strip 606 is positioned on the bottom of magnetic target 602 and a magnetic strip 608 is positioned on the top of target 602. Magnetic strips 606 and 608 may be the same as or similar to magnetic strips 224 and 226 (see FIG. 2), and may have opposite magnetic polarities as described above. For example, magnetic strip 606 may have a magnetic north pole on its inner edge (i.e. the edge facing central axis 605) and a magnetic south pole on its outer edge (i.e. the edge opposite central axis 605), while magnetic strip 608 may have a magnetic south pole on its inner edge and a magnetic north pole on its outer edge. The opposing polarities of magnetic strips 606 and 608 may produce a magnetic bias field (not shown in FIG. 6A) across regions 604. The magnetic bias field may be present at both the inner and outer surfaces of magnetic target 602.

System 600 also includes a magnetic field sensing element 610 coupled to a processor 612. Magnetic field sensing element 610 may be the same as or similar to magnetic field sensing element 504, and processor 612 may be the same as or similar to processor 505 (see FIG. 5). Magnetic field sensing element 610 produces an output signal 610a, which is received and processed by processor 612.

Magnetic field sensing element 610 may be placed adjacent to the outside surface of magnetic target 602, within the magnetic bias field, to detect the magnetic fields from regions 604. As magnetic target 602 rotates with respect to magnetic field sensing element 610, magnetic field sensing element 610 will detect the magnetic fields produced by regions 604 and produce an output signal 610a representing the detected field. For example, when magnetic field sensing element 610 detects a positive magnetic field from one or more of the regions 604, signal 610a may have a high voltage, and when magnetic field sensing element 610 detects a zero or negative magnetic field from one or more of the regions 604, signal 610a may have a relatively lower voltage, or vice versa.

To reduce jitter on signal 610a, magnetic field sensing element 610 may be positioned within the magnetic bias field produced by magnetic strips 606 and 608. Depending on the polarity of magnetic strips 606 and 608, the magnetic bias field across the outer surface of magnetic target 602 may have a magnetic direction parallel to central axis 605. The magnetic bias field across the inner surface 607 of target 602 may have a direction opposite to that of the magnetic bias field across the outside surface of target 602.

Magnetic field sensing element 610 may be positioned so that the orientation of its pinned layer is perpendicular to the orientation of the magnetic bias field, i.e. perpendicular to central axis 605. Placing magnetic field sensing element 610 within the magnetic bias field in this way may reduce jitter on signal 610a.

In another embodiment, magnetic field sensing element 610 may be positioned proximate to the inner surface 607 of magnetic target 602. In such an embodiment, magnetic field sensing element 610 may be placed within the magnetic bias field produced across the inner surface 607 of target 602 by magnetic strips 606 and 608.

Figure 6B:
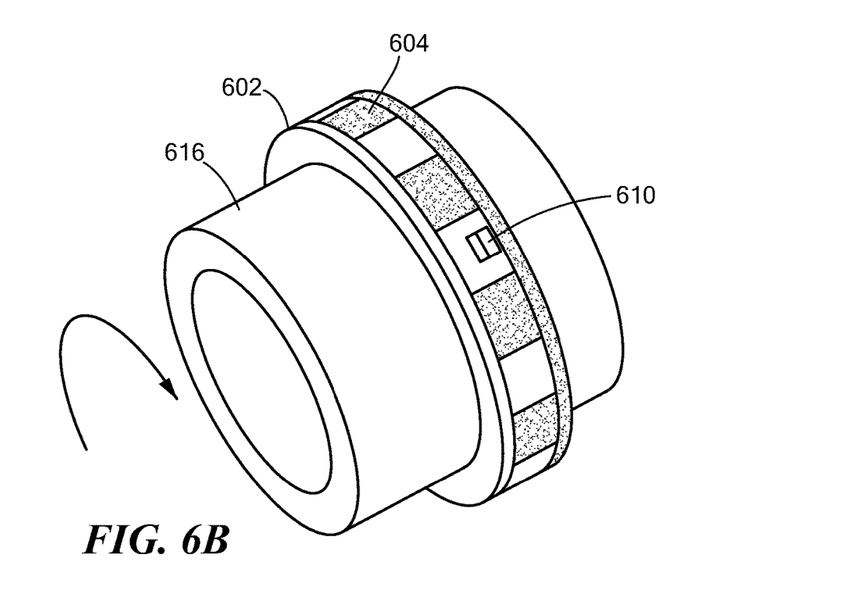

FIG. 6B is an isometric view of the magnetic target system 600 of FIG. 6A, where target 602 is placed around a rotating shaft 616. In this embodiment, as shaft 616 rotates, magnetic field sensing element 610 will detect the magnetic fields produced by regions 604 and produce signal 610a representing the detected magnetic field. Processor 612 (not shown in FIG. 6B) will receive and process signal 610a, which can be used to determine speed, position, and other parameters associated with rotating shaft 616.

Figure 7A:
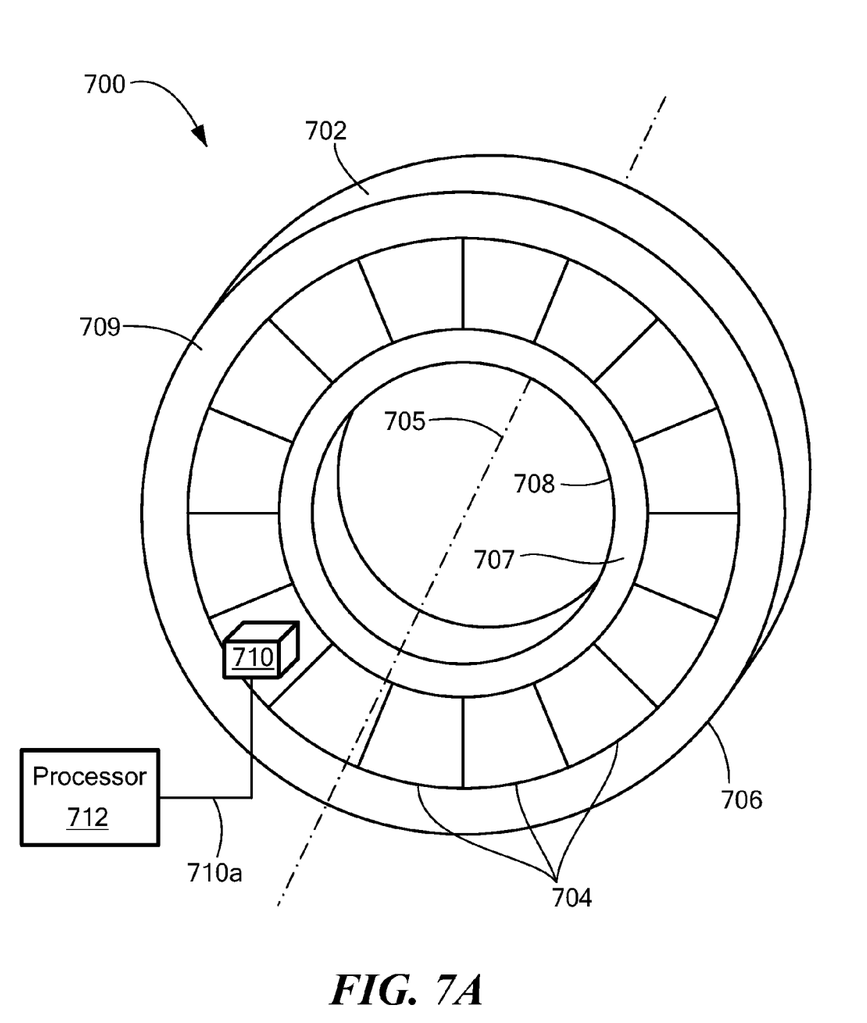
FIG. 7A and FIG. 7B are isometric views of a system for detecting an axial ring-shaped magnet target.

FIG. 7A is an isometric view of a system 700 that includes an axial magnetic target 702. Magnetic target 702 may be the same as or similar to target 200 (see FIG. 2). Magnetic target 702 has an array of regions 704, which may be the same as or similar to regions 202-212. Adjacent regions 704 may have different magnetic polarities, as described above with respect to regions 202-212. Magnetic target 602 may be referred to an axial ring-shaped target because regions 704 are arranged so that their magnetic direction is parallel to a central axis 705 of the target.

A magnetic strip 706 is positioned along an outer circumference of target 702, and a magnetic strip 708 is positioned along an opposing, inner circumference of target 702. Magnetic strips 706 and 708 may be the same as or similar to magnetic strips 224 and 226 (see FIG. 2), and may have opposite magnetic polarities. For example, magnetic strip 706 may have a magnetic north pole on a top edge 709 and a magnetic south pole on an opposite, bottom edge, while magnetic strip 708 may have a magnetic south pole on its top edge 707 and a magnetic north pole on its opposite, bottom edge. As described above, the opposing polarities of magnetic strips 706 and 708 may produce a magnetic bias field (not shown in FIG. 7A) across regions 704. The magnetic bias field may exist across (i.e. adjacent to) both on the top and bottom of target 702.

System 700 also includes a magnetic field sensing element 710 coupled to a processor 712. Magnetic field sensing element 710 may be the same as or similar to magnetic field sensing element 504, and processor 712 may be the same as or similar to processor 505 (see FIG. 5). Magnetic field sensing element 710 produces an output signal 710a, which is received and processed by processor 712.

Magnetic field sensing element 710 may be placed adjacent to the top of magnetic target 702, as shown. As target 702 rotates with respect to magnetic field sensing element 710, magnetic field sensing element 710 will detect the magnetic fields produced by regions 704 and produce an output signal 710a representing the detected magnetic fields. For example, when magnetic field sensing element 710 detects a positive magnetic field from one or more of the regions 704, signal 710a may have a high voltage, and when magnetic field sensing element 710 detects a zero or negative magnetic field from one or more of the regions 704, signal 710a may have a relatively lower voltage, or vice versa.

Magnetic field sensing element 710 may be positioned within the magnetic bias field produced by magnetic strips 706 and 708. Depending on the polarity of magnetic strips 706 and 708, for any point along the top of magnetic target 702, the magnetic bias field may have a magnetic direction (i.e. orientation) that points either toward central axis 705 or away from central axis 705. The magnetic bias field on the bottom of magnetic target 702 may have an orientation opposite to that of the magnetic bias field on the top of target 702. The orientation of the magnetic bias field, at any point along the bottom of target 702, may also point either toward central axis 705 or away from central axis 705, depending on the polarities of magnetic strips 706 and 708.

Magnetic field sensing element 710 may be positioned so that the orientation of its pinned layer is perpendicular to the orientation of the magnetic bias field. In other words, the orientation of magnetic field sensing element pinned layer may be perpendicular to a radius originating from central axis 705. Placing magnetic field sensing element 710 within the magnetic bias field in this way may reduce jitter on signal 710a.

In another embodiment, magnetic field sensing element 710 may be positioned proximate to the bottom of magnetic target 702. In such an embodiment, magnetic field sensing element 710 may be placed within the magnetic bias field produced on the bottom side of target 702.

Figure 7B:
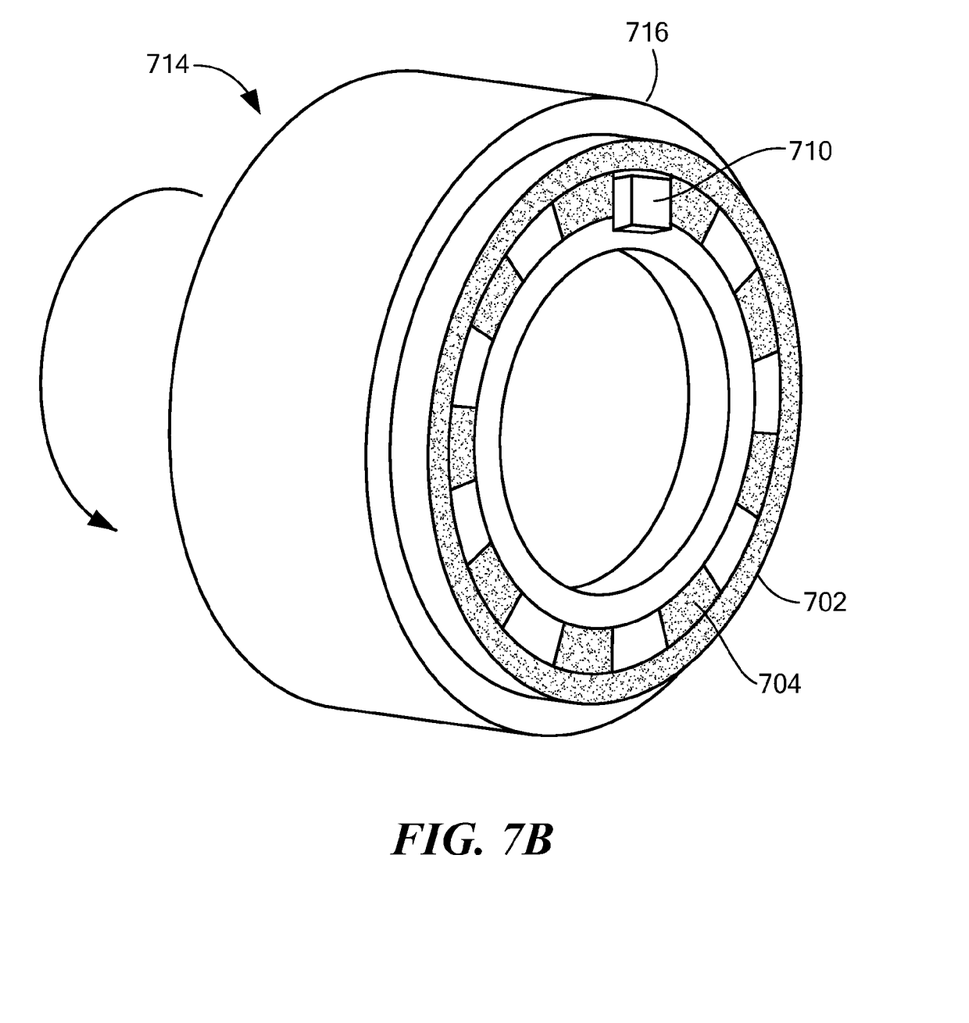

FIG. 7B is an isometric view of magnetic target system 714, where target 702 is placed on the end of a rotating shaft 716. In another embodiment, magnetic target 702 may be placed around the outside of a shaft, or on the inside (e.g. on an inner circumference) of a rotating pipe. As shaft 716 rotates, magnetic field sensing element 710 will detect the magnetic fields produced by regions 704 and produce signal 710a representing the detected magnetic field. Processor 712 (not shown in FIG. 7B) will receive and process signal 710a, which can be used to determine speed, position, and other parameters associated with the rotating shaft 716.

Figure 8:
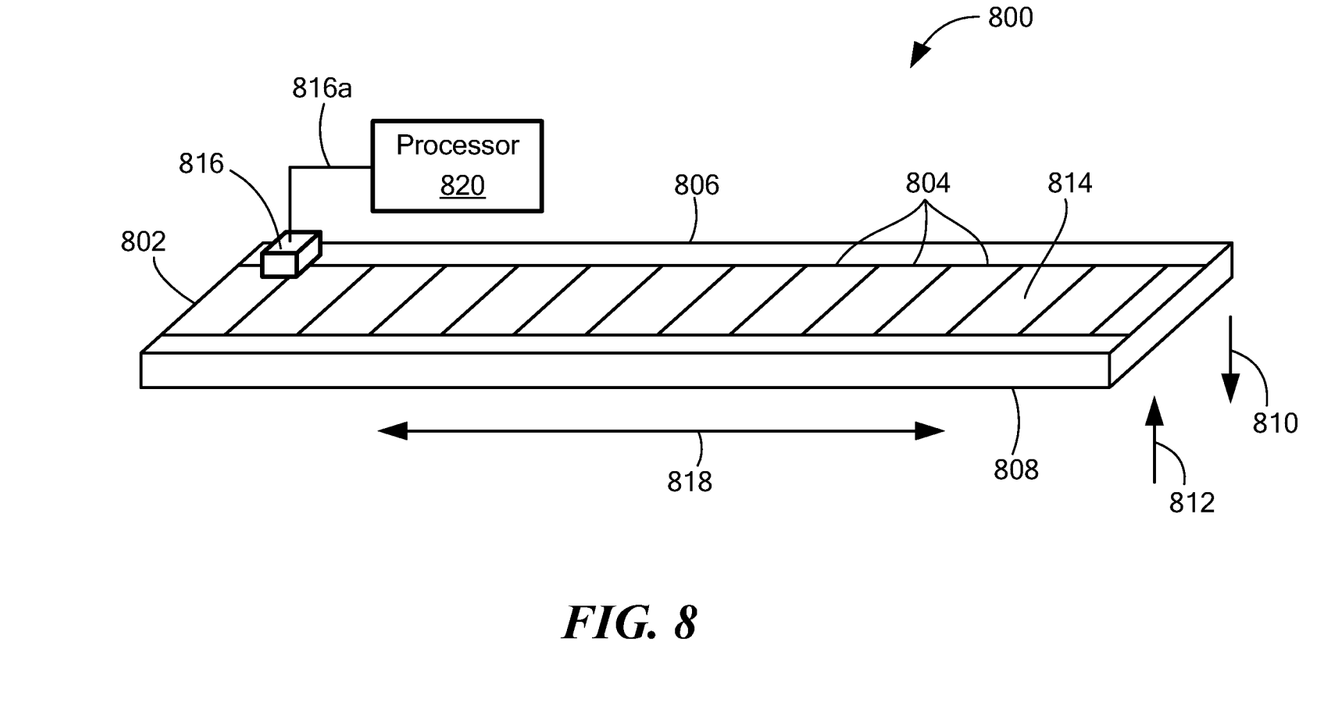
FIG. 8 is an isometric view of a system for detecting a bar-shaped magnetic bar.

FIG. 8 is an isometric view of a system 800 that includes bar-shaped magnetic target 802. Bar-shaped target 802 has an array of regions 804, which may be the same as or similar to regions 202-212 (see FIG. 2). Adjacent regions 804 may have different magnetic polarities, as described above with respect to regions 202-212.

Target 802 may include a magnetic strip 806 on one end of regions 804, and a magnetic strip 808 on an opposite end of regions 804. Magnetic strips 806 and 808 may have opposite magnetic polarities. For example, magnetic strip 806 may have a magnetic polarity in the direction of arrow 810, and magnetic strip 808 may have a magnetic polarity in the direction of arrow 812, or vice versa. Accordingly, magnetic strips 806 and 808 may produce a magnetic bias field across regions 804 on the top 814 and the opposite, bottom of target 802.

Magnetic field sensing element 816 may be positioned within the magnetic bias field and proximate to regions 804, so that as target 802 moves (e.g. in the direction of arrow 818), magnetic field sensing element 816 can detect the magnetic fields produced by regions 804. Magnetic field sensing element 816 may be positioned so that the magnetic orientation of magnetic field sensing element pinned layers is perpendicular to the magnetic bias field produced by magnetic strips 806 and 808. For example, magnetic field sensing element may be positioned so that the pinned layer is parallel to arrow 818.

As magnetic target 802 moves, magnetic field sensing element 816 produces signal 816a representing the magnetic field detected by magnetic field sensing element 816. Processor 818 receives and processes signal 816a to determine speed, position, or other parameters associated with target 802. Placing magnetic field sensing element 816 within the magnetic bias field produced by magnetic strips 806 and 808 can reduce jitter on signal 816a.

System 800 may be used to detect speed and position of a linear motion system. For example, bar-shaped target 802 may be mounted on a rack in a rack and pinion system. As the rack moves, processor 818 can use signal 816a to determine speed, position direction, and other parameters associated with the rack.

Figure 9:
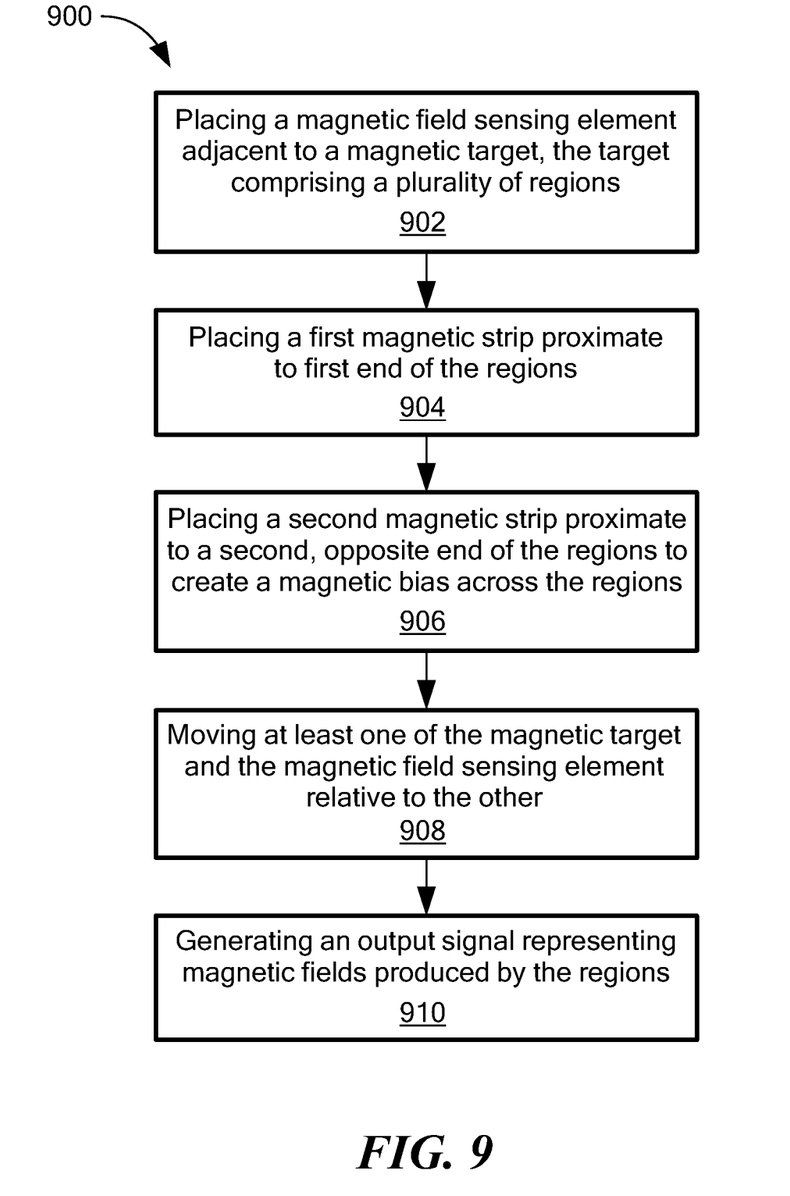
FIG. 9 is a flowchart of a method for detecting a magnetic target.

Referring to FIG. 9, a flowchart 900 depicts a method for detecting a magnetic target. In box 902, a magnetic field sensing element (e.g. magnetic field sensing element 504) is placed adjacent to a magnetic target. The magnetic target may be the same as or similar to ring-shaped target 200 and/or bar-shaped target magnet 800. The magnetic target may have a plurality of regions, each region having juxtaposed edges and opposing ends (e.g. regions 202-212). Adjacent regions may have different magnetic polarities. In box 904, a first magnetic strip (e.g. magnetic strip 224) is placed proximate to a first end of the regions. In box 906, a second magnetic strip (e.g. magnetic strip 226) is placed proximate to a second, opposite end of the regions. The magnet strips may have opposite magnetic polarities and may generate a magnetic bias field across the regions. In box 908, either the magnetic target or the magnetic field sensing element is moved relative the other, so that the magnetic field sensing element can detect magnetic fields generated by the regions. In box 910, an output signal representing the magnetic fields produced by the regions is generated.

In an embodiment, in box 906, the magnetic bias is generated in a direction substantially perpendicular to the pinned layer of the magnetic field sensing element. Due to the magnetic bias field, jitter on the output signal may be reduced.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims. All references cited herein are hereby incorporated herein by reference in their entirety.

What is claimed is:

1. An apparatus comprising:
a plurality of regions having juxtaposed edges and opposing ends, wherein adjacent ones of the plurality of regions have different magnetic polarities;
a first magnetic strip, having a first magnetic polarity, and disposed at one end of the regions, wherein the first magnetic polarity is a same polarity along the length of the first magnetic strip; and
a second magnetic strip, having a second magnetic polarity opposite to the first magnetic polarity, and disposed at a second end of the regions to generate a magnetic bias across at least a portion of the regions to reduce instability in measuring magnetic fields produced by the regions;
wherein the first magnetic strip and the second magnetic strip are discrete elements from the plurality of regions.

2. The apparatus of claim 1 wherein the regions, the first magnetic strip, and the second magnetic strip form a ring-shaped target.

3. The apparatus of claim 2 wherein the target is an axial target, the first magnetic strip is provided on an outer surface target, and the second magnetic strip is provided on an inner surface of the target.

4. The apparatus of claim 2 wherein the target is a radial target, the first magnetic strip is positioned on a top of the target, and the second magnetic strip is positioned on an opposite bottom of the target.

5. The apparatus of claim 1 wherein the regions, the first magnetic strip, and the second magnetic strip form a magnetic bar.

6. The apparatus of claim 1 wherein the regions, the magnetic strips, or both are formed from a hard ferromagnetic material.

7. The apparatus of claim 1 wherein the magnetic strips are positioned to generate the magnetic bias across all the regions.

8. The apparatus of claim 1 wherein at least one of the regions is formed from a molded magnetic material, the first magnetic strip is formed from a molded magnetic material, and/or the second magnetic strip is formed from a molded magnetic material.

9. A system comprising:
a magnetic target comprising:
a plurality of regions forming a body, the regions having juxtaposed edges and opposing ends, wherein adjacent ones of the plurality of regions have different magnetic polarities;
a first magnetic strip, having a first magnetic polarity, and disposed along an edge of the body formed by first ends of the plurality of regions, wherein the first magnetic polarity is a same polarity along the length of the first magnetic strip; and
a second magnetic strip, having a second magnetic polarity opposite to the first magnetic polarity, and disposed along a second edge of the body formed by second ends of the regions to generate a magnetic bias across at least a portion of the regions to reduce instability in measuring magnetic fields produced by the regions; and
at least one magnetic field sensing element placed in proximity to the magnetic target and configured to produce an output signal responsive to the magnetic target;
wherein the first magnetic strip and the second magnetic strip are discrete elements from the plurality of regions.

10. The system of claim 9 wherein at least one of the magnetic target and the magnetic field sensing element moves relative to the other one of the magnetic target and the magnetic field sensing element.

11. The system of claim 9 wherein the magnetic target is a ring-shaped target.

12. The apparatus of claim 11 wherein the target is an axial target, the first magnetic strip is provided on an outer surface of the target, and the second magnetic strip is provided on an inner surface of the target.

13. The apparatus of claim 11 wherein the target is a radial target, the first magnetic strip is positioned on a top of the target, and the second magnetic strip is positioned on a bottom of the target.

14. The system of claim 11 wherein the target is configured to rotate so that, during rotation, the magnetic regions move relative to the magnetic field sensing element.

15. The system of claim 9 wherein the magnetic target is a bar-shaped target.

16. The system of claim 15 wherein the bar is configured to move relative to the magnetic field sensing element so that, as the target moves, the magnetic regions move relative to the magnetic field sensing element.

17. The system of claim 9 wherein the magnetic field sensing element is a magnetoresistive element.

18. The system of claim 17 wherein the magnetic bias has a direction substantially perpendicular to a magnetic orientation of a pinned layer of the magnetoresistive element.

19. The system of claim 9 wherein the strength of the magnetic bias is substantially uniform across the regions.

20. The system of claim 19 wherein the magnetic bias has a strength sufficient to reduce jitter on the output signal of the magnetic field sensing element.

21. The system of claim 8 wherein the magnetic strips are positioned to generate the magnetic bias across all the regions.

22. A method comprising:
placing a magnetic field sensing element adjacent to a magnetic target, the target comprising a body formed from a plurality of regions having juxtaposed edges and opposing ends, wherein the adjacent ones of the plurality of regions have different magnetic polarities;
placing a first magnetic strip having a first magnetic polarity along one edge of the body formed by first ends of the regions so that the first magnetic strip is adjacent to each of the first ends of each of the regions, wherein the first magnetic polarity is a same polarity along the length of the first magnetic strip,
placing a second magnetic strip along a second, opposite edge of the body formed by second ends of the regions so that the second magnetic strip is adjacent to each of the second ends of the regions, wherein the first and second magnetic strips are placed at opposite ends of the regions to produce a magnetic bias across at least a portion of the regions to reduce instability in measuring magnetic fields produced by the regions, and wherein the first magnetic strip and the second magnetic strip are discrete elements from the plurality of regions;
moving at least one of the magnetic target and the magnetic field sensing element relative to the other one of the magnetic target and the magnetic field sensing element; and
generating, by the magnetic field sensing element, an output signal representing magnetic fields produced by the regions.

23. The method of claim 22 wherein placing the magnetic field sensing element includes placing a giant-magnetoresistive (GMR) element adjacent to the magnetic target.

24. The method of claim 23 wherein producing the magnetic bias includes producing a magnetic bias with a direction perpendicular to a magnetic orientation of a pinned layer of the GMR element.

25. The method of claim 22 wherein producing the magnetic bias includes producing a magnetic bias that is substantially uniform along at least a portion of a length of the plurality of regions extending between the ends of the regions.

26. The method of claim 22 wherein the magnetic target is in the form of a ring-shaped target and moving at least one of the magnetic target and the magnetic field sensing element relative to the other includes rotating the target.

27. An apparatus comprising:
a plurality of regions forming a body, the regions having juxtaposed edges and opposing ends, wherein adjacent ones of the plurality of regions have different magnetic polarities, and wherein first opposing ends of the plurality of regions form a first edge of the body and second opposing ends of the plurality of regions form a second edge of the body;
a first magnetic strip, having a first magnetic polarity, and disposed along the first edge of the body across the plurality of regions, wherein the first magnetic polarity is a same polarity along the length of the first magnetic strip; and
a second magnetic strip, having a second magnetic polarity opposite to the first magnetic polarity, and disposed along the second edge of the body and across the plurality of regions to generate a magnetic bias across at least a portion of the regions to reduce instability in measuring magnetic fields produced by the regions;
wherein the first magnetic strip and the second magnetic strip are discrete elements from the plurality of regions.

* * * * *

UNITED STATES PATENT AND TRADEMARK OFFICE
CERTIFICATE OF CORRECTION

PATENT NO. : 9,797,963 B2
APPLICATION NO. : 14/224106
DATED : October 24, 2017
INVENTOR(S) : Friedrich et al.

It is certified that error appears in the above-identified patent and that said Letters Patent is hereby corrected as shown below:

Column 2, Line 63, delete "(GaAs)" and replace with --(GaAs),--

Column 3, Line 49, delete "my represent" and replace with --may represent--

Column 11, Lines 51 and 59, delete both instances of "processor 818" and replace with --processor 820--

Column 12, Line 26, delete "embodiments" and replace with --embodiments,--

Signed and Sealed this
Tenth Day of July, 2018

Andrei Iancu
*Director of the United States Patent and Trademark Office*